(12) United States Patent
Boerstler

(10) Patent No.: US 6,198,320 B1
(45) Date of Patent: Mar. 6, 2001

(54) DIFFERENTIAL CHARGE PUMP AND FILTER WITH COMMON-MODE VOLTAGE CONTROL

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/943,426

(22) Filed: Oct. 3, 1997

(51) Int. Cl.[7] .......................................... H03L 7/06
(52) U.S. Cl. ............................. 327/157; 327/536
(58) Field of Search ..................... 327/148, 157, 327/536, 306, 309, 310, 311, 316, 321

(56) References Cited

U.S. PATENT DOCUMENTS

| | | | |
|---|---|---|---|
| 5,619,161 | * 4/1997 | Novof et al. ...................... 327/535 |
| 5,736,880 | * 4/1998 | Bruccoleri et al. ................ 327/157 |
| 5,740,213 | * 4/1998 | Dreyer .............................. 327/157 |
| 5,831,484 | * 11/1998 | Lukes et al. ...................... 327/157 |
| 5,870,003 | * 2/1999 | Boerstler ........................... 327/157 |
| 5,936,445 | * 8/1999 | Babanezhad et al. ............. 327/157 |

* cited by examiner

*Primary Examiner*—Tuan T. Lam
(74) *Attorney, Agent, or Firm*—Casimer K. Salys; Felsman, Bradley, Vaden, Gunter & Dillon, LLP

(57) ABSTRACT

A charge pump and filter for a phase-lock loop circuit are provided with common-mode voltage control for differential outputs to be used by a voltage-controlled oscillator. The common-mode voltage controller preferably initializes capacitors in the filter to an optimum common-mode voltage in response to a reset signal. Common-mode voltage is controlled using currents that are small compared to currents generated by the charge pump (less than 20 $\mu$A).

19 Claims, 3 Drawing Sheets

DIFFERENTIAL CHARGE PUMP AND FILTER WITH COMMON-MODE VOLTAGE CONTROL

BACKGROUND OF THE INVENTION

1. Field of the Invention

The present invention generally relates to electronic clock circuits, and more particularly to an electronic clock for a microprocessor, that uses a phase-lock loop (PLL) circuit having an improved charge pump which compensates for common-mode voltages at the differential inputs of a voltage-controlled oscillator.

2. Description of the Related Art

Electronic circuits that provide clock signals are used in a wide assortment of devices, and particularly in computer systems. Microprocessors and other computer components, such as random access memory (RAM), device controllers and adapters, use clock signals to synchronize various high-speed operations. These computer clock circuits often use a phase-lock loop (PLL) circuit to synchronize (de-skew) an internal logic control clock with respect to an external system clock.

A typical prior art PLL circuit 1 is shown in FIG. 1 and includes a phase/frequency detector (PFD) 2, a charge pump 3, a low-pass filter 4, and a voltage-controlled oscillator (VCO) 5. Phase/frequency detector 2 compares two input signals, a reference signal $f_{ref}$ (from the external system clock) and a feedback signal $f_{fb}$, and generates phase error signals that are a measure of the phase difference between $f_{ref}$ and $f_{fb}$. The phase error signals ("UP" and "DOWN") from detector 2 are used to generate control signals by charge pump 3 which are filtered by low-pass filter 4 and fed into the control input of voltage-controlled oscillator 5. Voltage-controlled oscillator 5 generates a periodic signal with a frequency which is controlled by the filtered phase error signal. The output of voltage-controlled oscillator 5 is coupled to the input $f_{fb}$ of phase/frequency detector 2 directly or indirectly through other circuit elements such as dividers 6, buffers (not shown) or clock distribution networks (not shown), thereby forming a feedback loop. If the frequency of the feedback signal is not equal to the frequency of the reference signal, the filtered phase error signal causes the frequency of voltage-controlled oscillator 5 to shift (upwards or downwards) toward the frequency of the reference signal, until voltage-controlled oscillator 5 finally locks onto the frequency of the reference; following frequency acquisition, phase acquisition is achieved in a similar manner. The output of voltage-controlled oscillator 5 is then used as the synchronized signal (for internal logic control). In cases where the incoming data is a self-clocking bit stream, the comparator system is used to extract the clock information from the data stream itself.

PLL's for microprocessors must exhibit high tolerance to electrical noise generated by the large number of rapidly switching logic circuits that are fabricated on the same die (silicon substrate or microchip). Differential circuits (rather than single-ended circuits) are accordingly preferred for these applications, but at present they are generally in use for only selected portions of the PLL, such as the voltage-controlled oscillator signal path (but not the control path of the voltage-controlled oscillator). See "A PLL Clock Generator with 5 to 110 MHz of Lock Range for Microprocessors," IEEE Journal of Solid-State Circuits, vol. 27, no. 11, pp. 1599–1607 (November 1992), and "A Wide-Bandwidth Low-Voltage PLL for PowerPC™ Microprocessors" IEEE Journal of Solid-State Circuits, vol. 30, no. 4, pp. 383–391 (April 1995).

One problem that can arise with differential circuits in a PLL circuit relates to common-mode voltage. In a differential circuit, a value is based on the relative voltages of two signals, i.e., their difference, and not their absolute values. A common-mode voltage is a voltage that is applied equally to both signals, whereby the absolute values of the voltages are higher, although the difference between the voltages remains constant. A circuit element with differential inputs may be designed with an n-type field-effect transistor (nfet) source-coupled pair at the input, or a p-type field-effect transistor (pfet) source-coupled pair at the input. These transistors are sensitive to common-mode voltages that arise from the signal source, such as those resulting from excessive noise, leakage currents, and nfet or pfet operating characteristics. If the common-mode of the signal from the filter moves in such a way that the input stage begins to shut off (e.g., a high common-mode voltage for a pfet source-coupled pair), then the stability of the circuit can deteriorates dramatically and eventually fail to operate. This phenomenon is particularly troublesome with high-speed clock circuits, e.g., those with speeds greater than a few hundred megahertz.

One approach to handling such high common-mode voltages in a voltage-controlled oscillator would be to provide more sophisticated input stages. The resulting bandwidth reduction on the control input would, however, render such a voltage-controlled oscillator practically useless due to the loss of the required high frequency signal caused by the zero frequency in the transfer function. It would, therefore, be desirable and advantageous to devise an improved PLL clocking circuit having a differential component, such as a voltage-controlled oscillator, in which common-mode voltages of the inputs are controlled to alleviate the foregoing problems.

SUMMARY OF THE INVENTION

It is therefore one object of the present invention to provide an improved clock circuit, such as may be used with a microprocessor.

It is another object of the present invention to provide such a clock circuit having a phase-lock loop (PLL) which uses a charge pump and filter to supply differential control inputs to a voltage-controlled oscillator.

It is yet another object of the present invention to provide a clock circuit using such a charge pump and filter which controls or compensates for common-mode voltages arising at the control inputs.

The foregoing objects are achieved in a circuit generally comprising charge pump means for receiving one or more error signals and generating two output control signals, means for filtering the output control signals, including capacitor means for storing electrical charge, and means for controlling a common-mode voltage at the capacitor means. The means for controlling the common-mode voltage can include means for clamping the output control signals at high voltages, and further preferably includes means for initializing the capacitor means to an optimum common-mode voltage in response to a reset signal. The means for controlling the common-mode voltage generates currents that are small compared to currents generated by the charge pump means (less than 20 μA). A phase-lock loop (PLL) can be constructed using this circuit, along with phase/frequency detector means for supplying the one or more error signals, and voltage-controlled oscillator means for providing a feedback signal to the phase/frequency detector means.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 1:
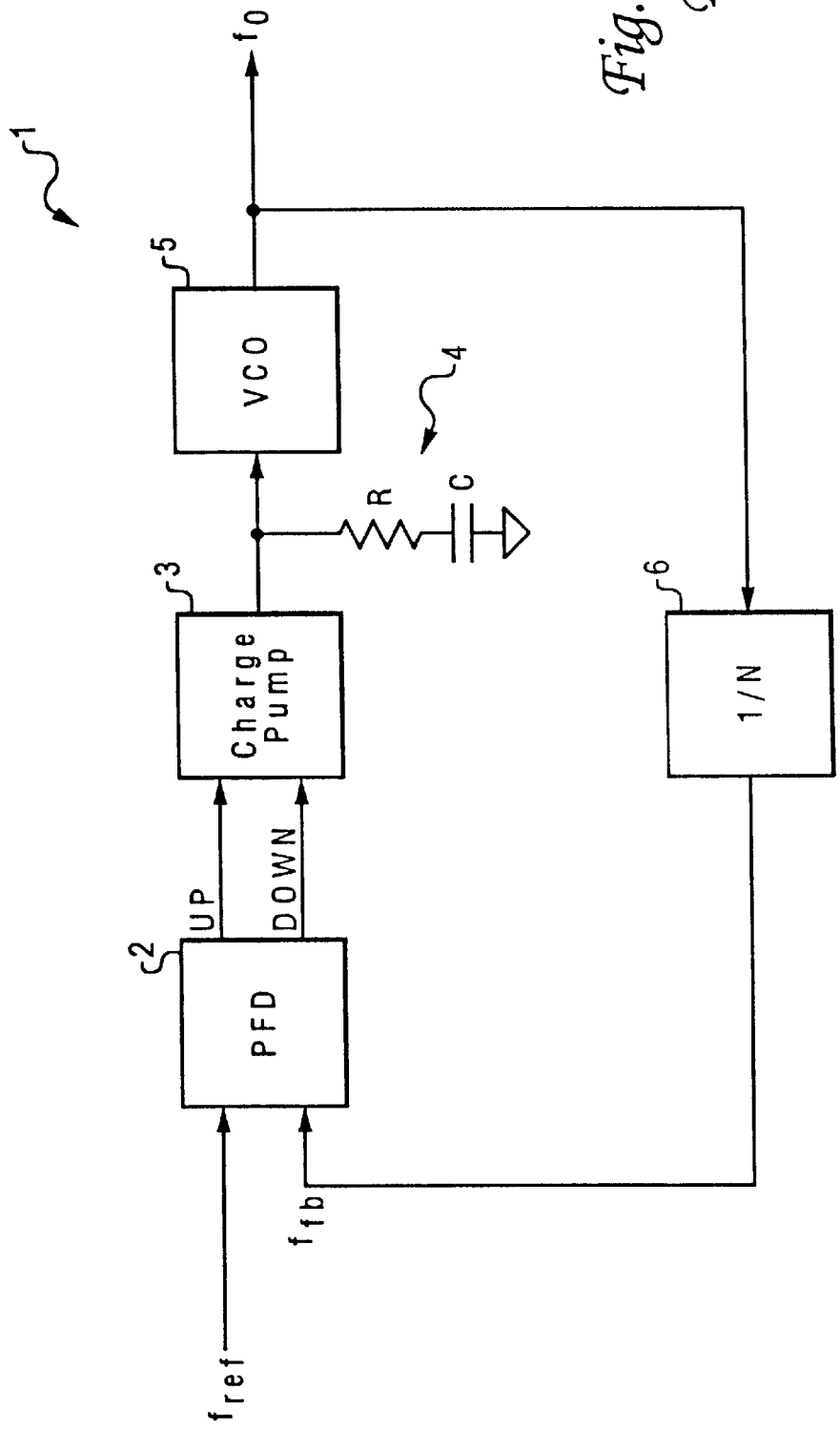
FIG. 1 is block diagram of a prior art phase-lock loop (PLL) circuit.
Figure 2:
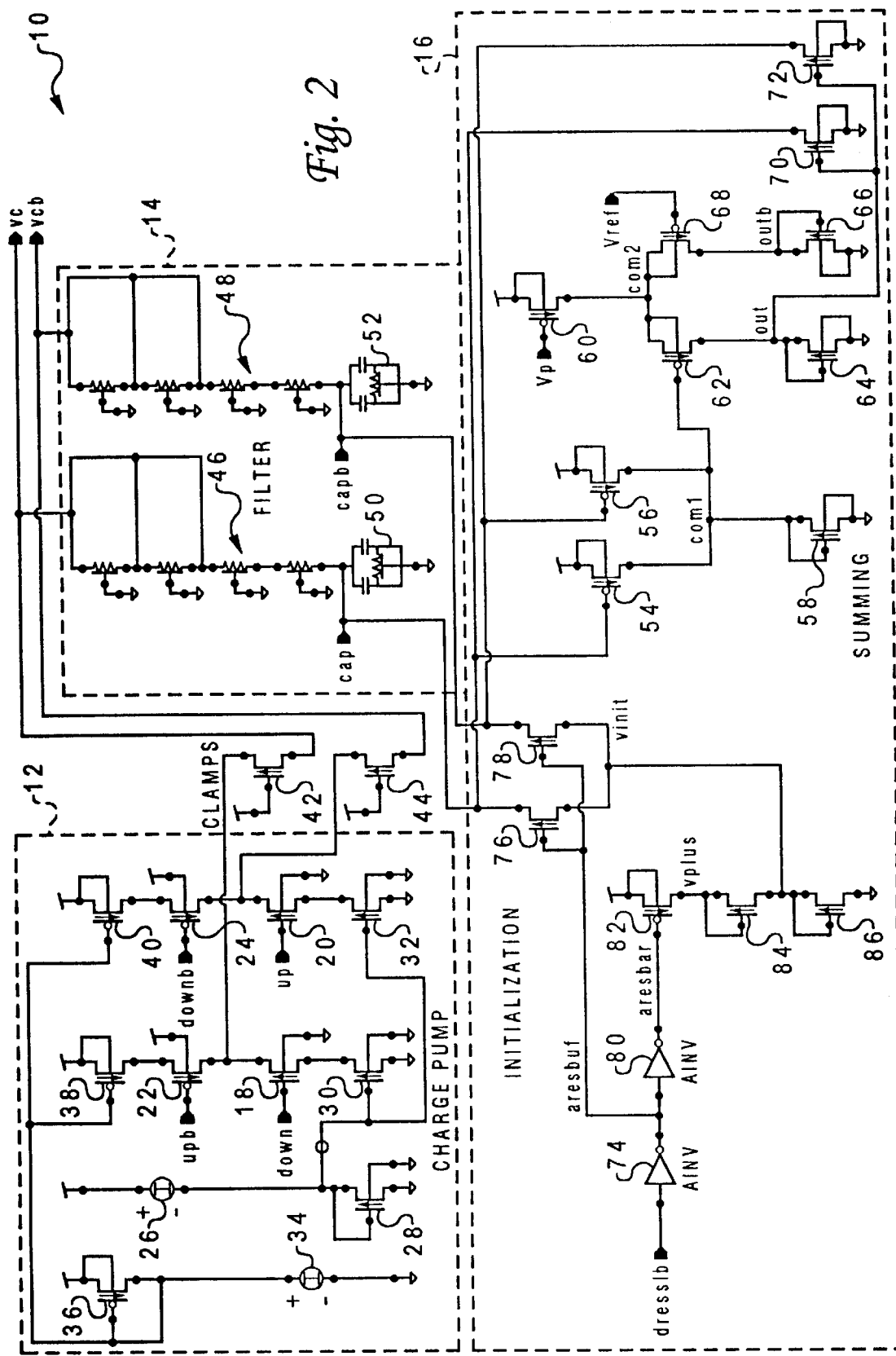
FIG. 2 is a detailed schematic diagram of one embodiment of a charge pump and filter constructed in accordance with the present invention, which compensates for common-mode voltages and which may be used to build an improved PLL circuit.

With reference now to the figures, and in particular with reference to FIG. 2, there is depicted one embodiment 10 of a circuit constructed in accordance with the present invention, and adapted for use in a phase-lock loop (PLL) circuit. Circuit 10 is generally comprised of a charge pump 12, a filter 14, and a common-mode voltage controller 16. In this embodiment, circuit 10 is used to create differential input signals $V_c$ and $V_{cb}$ which are fed to a voltage-controlled oscillator (not shown in FIG. 2) having a source-coupled pair of p-type metal-oxide semiconducting field-effect transistors (pfets). A PLL which uses circuit 10 may include additional components such as a phase/frequency detector (not shown in FIG. 2), connected in a manner similar to that shown in FIG. 1, wherein the outputs of the phase/frequency detector (UP, UPB, DOWN, DOWNB) are provided to charge pump 12. A suitable phase/frequency detector is described in U.S. patent application Ser. No. 08/888,797. As will become apparent to those skilled in the art, circuit 10 is particularly useful in a PLL circuit designed for a high-speed computer clock.

Charge pump 12 includes a pair of n-type metal-oxide semiconducting field-effect transistors (nfets) 18 and 20 which are respectively connected to the UP and DOWN inputs provided from the phase/frequency detector. A pair of pfets 22 and 24 are similarly connected to the complementary signals UPB and DOWNB. A first constant current source 26 is coupled to three other nfets 28, 30 and 32 to form two current mirrors that are respectively connected to nfets 18 and 20. A second constant current source 34 is similarly coupled to three other pfets 36, 38 and 40 to form two current mirrors that are respectively connected to pfets 22 and 24. The devices are connected as indicated to a power supply $V_{dd}$ or $AV_{dd}$ (analog voltage $V_{dd}$) which, in the depicted embodiment, is about 2.5 volts.

When the DOWN signal is asserted, current is sunk by the drain of nfet 18 which is further coupled to a first differential output $V_c$ via a clamping nfet 42. When the UP signal is asserted, current is sunk by the drain of nfet 20, which is further coupled to a second differential output $V_{cb}$ via another clamping nfet 44. Conversely, when the DOWNB signal is asserted, current is sourced by the drain of pfet 24 which is connected to the drain of nfet 20 and, when the UPB signal is asserted, current is sourced by the drain of pfet 22, which is connected to the drain of nfet 18. Since the DOWNB signal is the inverse of the DOWN signal and DOWNB is "active" in the low (zero) state, nfet 18 operates together with pfet 24. Similarly, since the UPB signal is the inverse of the UP signal and UPB is also "active" in the low (zero) state, nfet 20 operates together with pfet 22. In this manner, the error signals from the phase/frequency detector are used to gate the currents and generate the control output signals, which become inputs to the voltage-controlled oscillator. In the particular embodiment of circuit 10, charge pump 12 generates control signals with currents in the range of 30–90 $\mu A$.

The output control signals $V_c$ and $V_{cb}$ are conditioned by filter 14, which includes a first RC filter 46 connected to output $V_c$, and a second RC filter 48 connected to output $V_{cb}$. Each RC filter preferably includes a plurality of precision resistors which are interconnected in such a manner as to allow trimming of the RC filter resistance by cutting one or more of the interconnecting leads using a tool or laser. Each RC filter also has a capacitive element 50, 52. In other words, the currents from nfets 42 and 44 are used charge or discharge the filter capacitors as the error signals are asserted, which accordingly causes the voltage at the outputs $V_c$ and $V_{cb}$ to increase or decrease.

Common-mode voltages can arise in charge pump 12 and filter 14 due to various reasons, such as leakage currents, excessive noise, and device operating characteristics, potentially allowing $V_c$ and $V_{cb}$ to rise above (or fall below) $V_{dd}-V_t$ over a long period of time. The voltages at the capacitor nodes CAP and CAPB are sensed respectively by pfets 54 and 56, and represent the average value of the voltages at $V_c$ and $V_{cb}$. Pfets 54 and 56 generate currents which are proportional to $V_{dd}-V_c$ and $V_{dd}-V_{cb}$, respectively. These currents are added using an nfet 58 so that the voltage at the drain node of nfet 58 is proportional to the sum of the currents, effectively monitoring (inversely) the common-mode voltage of $V_c$ and $V_{cb}$. The voltage at this node is compared to an external reference voltage $v_{ref}$ using the gain stage comprised of pfets 60, 62 and 68, and nfets 64 and 66. An external voltage $v_p$ is used to bias pfet 60 in the constant-current region. An exemplary value for $v_p$ is 1.5 volts although this is somewhat dependent on temperature, the fabrication process and the power supply, and can be controlled by monitoring the temperature of the circuit.

Figure 3:
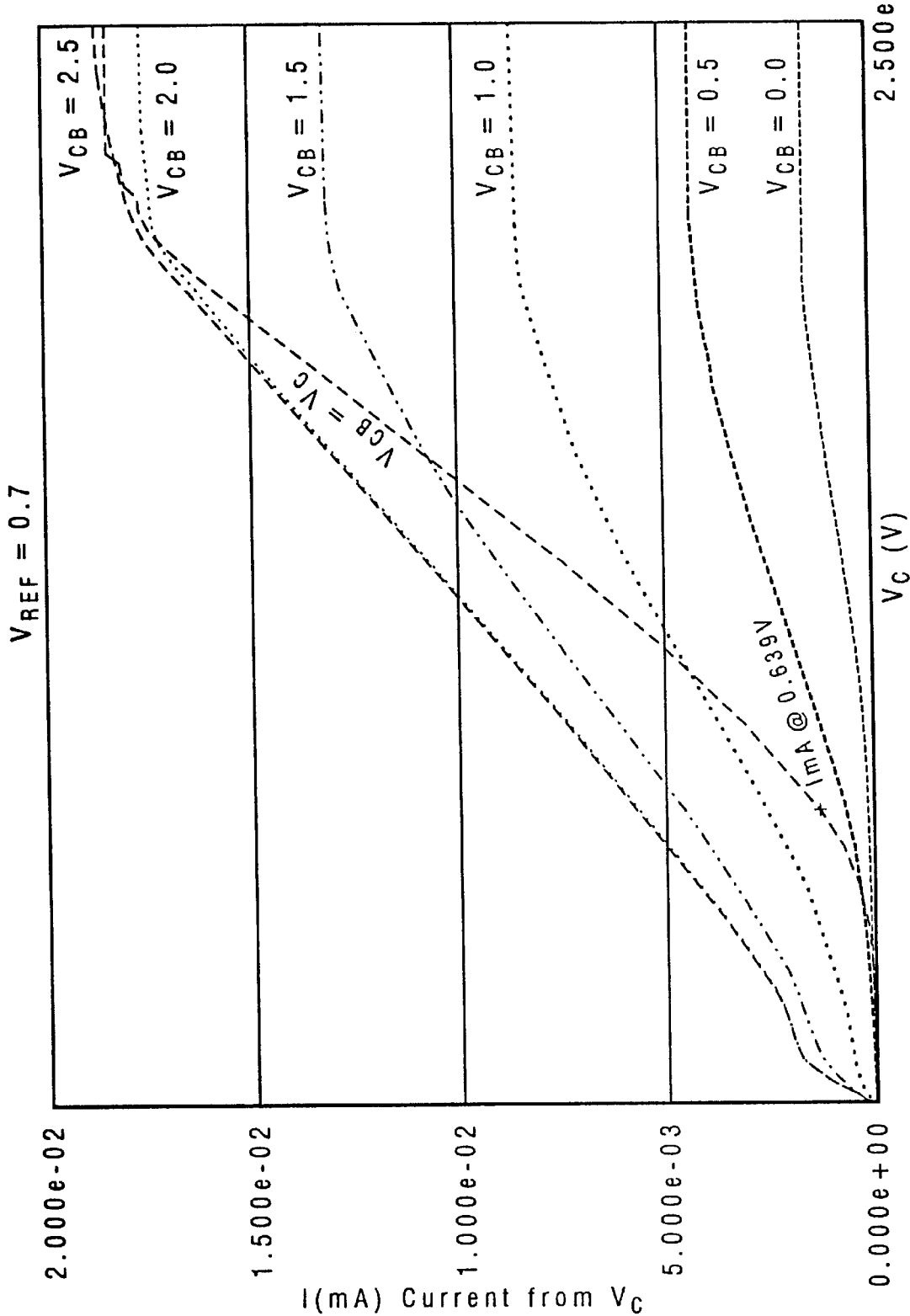
FIG. 3 is a graph showing the common-mode voltage compensation response for the charge pump of FIG. 2 for various common-mode voltages.

As the common-mode voltage ($V_c+V_{cb}$) increases, the voltage at the drain node of nfet 58 decreases, causing more current to flow through pfet 62 and increasing the voltage at the drain node (out) of nfet 64. Nfet current sinks 70 and 72 draw currents proportional to the common-mode voltage from the filter capacitors 50 and 52. The currents so drawn are small compared to the currents sourced or sunk by charge pump 12, and are matched so that the common-mode voltage is reduced without overcompensating, while the differential voltage is unaffected. The currents sunk by nfets 70 and 72 are shown as a function of common-mode voltage in FIG. 3 (for $V_{ref}$=0.7 volts). Under normal conditions, these currents will be less than 5 $\mu A$, and are limited to less than 20 $\mu A$ (about 18 $\mu A$) under worst case common-mode conditions.

Common-mode voltage controller 16 is initialized in response to assertion of the power-on reset signal (complement). That signal is connected to an inverter 74 whose output controls two nfets 76 and 78 that are respectively connected to the CAP and CAPB nodes. The output of inverter 74 is also fed to another inverter 80 whose output further controls a pfet 82 that supplies an initialization reference voltage to nfets 76 and 78 via a voltage divider comprised of nfets 84 and 86. In this manner, when the power-one reset signal (complement) is sent, pfet 82 conducts and a voltage $V_{init}$ is generated. This voltage charges capacitors 50 and 52 since nfets 76 and 78 are turned on. $V_{init}$ is preferably the optimum common-mode value, approximately equal to $(V_{dd}-V_t)/2$ (around 0.8 volts). Nfets 76 and 78 are preferably low impedance to allow quick charging to $V_{init}$. This initialization circuit ensures rapid and predictable loop acquisition.

Clamping nfets 42 and 44 provide further protection against high common-mode voltages. For low values of $V_c$ and $V_{cb}$, nfets 42 and 44 are conducting, effectively transferring the currents from or to the charge pump. Nfets 42 and 44 will conduct until their source voltages ($V_c$ and $V_{cb}$) are approximately $V_{dd}-V_t$ where $V_t$ is the threshold voltage of the device. Since the bulk-to-source voltage ($V_{bs}$) is large, the value of $V_t$ is much larger than the $V_t$ of a device with a grounded source, and may be as much as two times larger. Hence, $V_c$ and $V_{cb}$ are limited to voltages of less than $V_{dd}-0.8$, as a first order approximation, and so do not reach higher levels which would turn off the voltage-controlled oscillator. Voltage clamping with an nfet source-coupled pair input for the voltage-controlled oscillator would clamp the output control signals at a low voltage rather than a high voltage.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A circuit for supplying differential control signals based on one or more error signals, comprising:
    charge pump means for receiving the one or more error signals and generating two output control signals;
    means for filtering said output control signals, including capacitor means for storing electrical charge; and
    means for controlling a common-mode voltage at said capacitor means by drawing current from said capacitor means, said controlling means including means for initializing said capacitor means to an optimum common-mode voltage in response to a reset signal.

2. The circuit of claim 1 wherein said means for controlling the common-mode voltage includes means for clamping the output control signals at high voltages.

3. The circuit of claim 1 wherein said means for controlling the common-mode voltage includes means for clamping the output control signals at low voltages.

4. The circuit of claim 1 wherein said charge pump means includes means for drawing current from and sourcing current to said capacitor means in response to the one or more error signals.

5. A phase-lock loop (PLL) using the circuit of claim 1, and further comprising:
    phase/frequency detector means for supplying the one or more error signals; and
    voltage-controlled oscillator means for providing a feedback signal to said phase/frequency detector means, said feedback signal being based on said output control signals.

6. The circuit of claim 1 wherein said capacitor means includes first and second capacitance units coupled to respective nodes of said charge pump means.

7. The circuit of claim 2 wherein said clamping means includes first and second field-effect transistors connected to respective nodes of said charge pump means.

8. The circuit of claim 4 wherein said means for controlling the common-mode voltage generates currents that are applied to said capacitor means, said currents being small compared to currents generated by said charge pump means.

9. The circuit of claim 4 wherein:
    said capacitor means includes first and second capacitance units coupled to respective nodes of said charge pump means; and
    said means for controlling the common-mode voltage includes means for generating a voltage which is proportional to a sum of currents driven by charges stored in said first and second capacitance units.

10. The circuit of claim 8 wherein said currents generated by said means for controlling the common-mode voltage are less than 20 $\mu A$.

11. A circuit for use in a phase-lock loop, the circuit comprising:
    a charge pump having one or more inputs for receiving one or more error signals, and including means for generating first and second differential control signals at first and second outputs, respectively;
    a first filter connected to said first output of said charge pump, having first capacitor means for storing a first electrical charge;
    a second filter connected to said second output of said charge pump, having second capacitor means for storing a second electrical charge; and
    a common-mode voltage controller having means for drawing current from and sinking current to said first and second capacitor means to control a common-mode voltage at said first and second capacitor means, said common-mode voltage controller including means for initializing said first and second capacitor means to a optimum common-mode voltage in response to a reset signal.

12. The circuit of claim 11 further comprising means for clamping said first and second differential control signals at high voltages.

13. The circuit of claim 11 wherein said charge pump includes means for drawing current from and sourcing current to said first and second capacitor means in response to the one or more error signals.

14. A phase-lock loop (PLL) using the circuit of claim 11, and further comprising:
    a phase/frequency detector having one or more outputs supplying the one or more error signals, and having a first input which receives a reference clock signal; and
    a voltage-controlled oscillator having a feedback output which is coupled to a second input of said phase/frequency detector.

15. The circuit of claim 12 wherein said clamping means includes first and second field-effect transistors connected to respective nodes of said first and second capacitor means.

16. The circuit of claim 13 wherein said common-mode voltage controller generates currents that are applied to said first and second capacitor means, said currents being small compared to currents generated by said charge pump.

17. The circuit of claim 13 wherein said common-mode voltage controller includes means for generating a voltage which is proportional to a sum of currents driven by charges stored in said first and second capacitor means.

18. The circuit of claim 16 wherein said currents generated by said common-mode voltage controller are less than 20 μA.

19. A phase-lock loop circuit comprising:

a phase/frequency detector having a first input for receiving a reference clock signal, a second input for receiving a feedback signal, and one or more outputs supplying one or more error signals based on said reference clock and feedback signals;

a charge pump having one or more inputs for receiving the one or more error signals from said phase/frequency detector, and including means for generating first and second differential control signals at first and second outputs, respectively;

a first filter connected to said first output of said charge pump, having first capacitor means for storing a first electrical charge;

a second filter connected to said second output of said charge pump, having second capacitor means for storing a second electrical charge;

a common-mode voltage controller having means for drawing current from and sinking current to said first and second capacitor means, to control a common-mode voltage at said first and second capacitor means, and means for initializing said first and second capacitor means to an optimum common-mode voltage in response to a reset signal;

means for clamping said control signals at high voltages; and a voltage-controlled oscillator having an output which is coupled to said second input of said phase/frequency detector means.

* * * * *